(12) United States Patent
Stautner

(10) Patent No.: US 6,192,690 B1
(45) Date of Patent: Feb. 27, 2001

(54) LOAD BEARING APPARATUS IN NMR CRYOSTAT SYSTEM

(75) Inventor: Wolfgang Stautner, Oxford (GB)

(73) Assignee: Oxford Magnet Technology Limited, Oxen (GB)

(*) Notice: Subject to any disclaimer, the term of this patent is extended or adjusted under 35 U.S.C. 154(b) by 0 days.

(21) Appl. No.: 09/157,409

(22) Filed: Sep. 21, 1998

(30) Foreign Application Priority Data

Sep. 30, 1997 (GB) .................................................. 9720638

(51) Int. Cl.$^7$ ........................................................ F25B 9/00

(52) U.S. Cl. ..................................................................... 62/6

(58) Field of Search ........................................ 62/6, 51.1

(56) References Cited

U.S. PATENT DOCUMENTS

| | | | | |
|---|---|---|---|---|
| 5,237,825 | * | 8/1993 | Menzi et al. ........................... | 62/51.1 |
| 5,295,355 | * | 3/1994 | Zhou et al. .................................. | 62/6 |
| 5,339,650 | * | 8/1994 | Hakamada et al. .................... | 62/51.1 |

FOREIGN PATENT DOCUMENTS 2 301 426   12/1996 (GB) .

* cited by examiner

*Primary Examiner*—Corrine McDermott
*Assistant Examiner*—Malik N. Drake
(74) *Attorney, Agent, or Firm*—Evenson, McKeown, Edwards & Lenahan, P.L.L.C.

(57) ABSTRACT

The present invention relates to a cooling system for cryostats or transport containers for liquids incorporating a PTR cooler. The cryostat usually consists of several interior cylindrical or otherwise shaped vessels for storing liquids. In particular, the cryostat for NMR applications and related fields usually comprises an outer vacuum case, sometimes also a nitrogen can, as well as one or several radiation shields and the helium vessel housing the superconducting magnet whereas the latter usually is made of NbTi, $Nb_3Sn$, and/or some HTC conductor. It is the aim of the present invention to use a pulse tube cooler by incorporation into an NMR cryostat via an opening, an opening refers to the neck tube itself or to any other means for accessing the cryostat for filling or for energising the magnet or acting conjointly as a pressure relief tube or/and as a drainage outlet e.g. for storage tanks and most generally for using the pulse tube as a means for rigidly suspending or supporting various parts in a cryostat.

24 Claims, 5 Drawing Sheets

LOAD BEARING APPARATUS IN NMR CRYOSTAT SYSTEM

The present invention relates to load bearing means for use in NMR cryostat systems as a support or suspension element.

FIG. 1 shows a typical cryostat for a superconducting magnet with a warm clear bore for NMR applications. The cryostat comprises a nitrogen tank 1 or an 80K aluminium radiation shield, and a helium tank 2 housing the magnet 4. An intermediate shield 3 is provided usually at a temperature of 42K.

An NMR system provides access to a room temperature bore of the cryostat for introducing an NMR probe to the magnet centre. The probe usually comprises a sample and radio-frequency coils for inducing transverse magnetisation The various components comprising a cryostat or storage tank for cryogenic liquids are generally either suspended or supported by each other. Thus, a suspension system has various tasks, namely carrying the magnet or shield loads, and e.g. keeping the position of the cold mass during shipping and maintaining the internal clearances between the radiation shields during installation as well as at repeated cooldown or thermal cycling. Meeting all these requirements means that the suspension imposes a heat load onto the internal parts of the cryostat, and this causes a higher boil-off of liquids, although the percentage of total heat load is dependant on the overall size of the system.

Various parts of the cryogenic components such as radiation shields have to be cooled, either by using liquids by means of heat exchange between the evaporating gas and the surface to be cooled, or by other means such as conventional GM-cryocoolers.

The first attempts at installing GM-type coolers were made about fifteen years ago and, up to now, only very few applications use externally installed piston-driven coolers for shield cooling in NMR systems, because the piston movement induces vibrations and eddy currents which in turn affect the homogeneity or the signal resolution, in that the signal is distorted by the superimposed frequency spectrum.

However, due to the absence of moving parts in a pulse tube refrigerator, apart from the pressure wave travelling down the tube, the induced level of vibrations transmitted to the internal cryostat structure is several orders of magnitude lower than with piston-driven coolers. Such pulse tube refrigerators can be directly mounted and very little vibration experienced. Thus it is feasible to apply the whole spectrum of means for directly contacting or coupling a radiation shield to a cooler, such as soldering, bolting, riveting, screwing, clamping, gluing, welding, sliding, pressing, or by means of shrink-fitting or spring-loading, or mechanically by using a lever-actuated contacting system. Most probably, the radiation shield is made of highly-conducting materials such as aluminium or aluminium alloys etc., whereas the helium can incorporating the superconducting magnet is made of stainless steel or epoxy or aluminium or other non-magnetic material or a combination of several different materials.

An aim of the present invention is to combine both aforementioned functions, namely suspending and cooling, and to use the pulse tube refrigerator to effect these tasks.

The pulse tube refrigerator can be arranged in series or in parallel along the axis of a cryostat, or could be single- or multi-staged, or if the second/third stage of the pulse tube reaches a temperature where liquids could be liquefied, could provide an additional liquefying stage with attached heat exchanger. The pulse tube refrigerator could also suspend or support a superconducting magnet where the latter is usually made of NbTi, $Nb_3Sn$ or HTS material, and is housed within a cryostat structure. Since the pulse tube refrigerator is used as either a suspension or support member and an integral part, or so-called "invisible part" of a cryostat it can also simultaneously cool the shields affixed to it and at the same time carry shield and or magnet loads.

A further aim of the invention is to use a neck pulse tube or a room temperature bore pulse tube for NMR systems as a suspension system.

It is understood and self-explanatory that due to its design a pulse tube refrigerator is defined as being a combination of two tubes, namely the pulse tube itself and the tube housing the regenerator.

According to the present invention, there is provided load bearing means including at least one pulse tube refrigerator arranged to support or suspend members in an NMR system, while simultaneously cooling the members.

The pulse tube refrigerator may be a multi-stage pulse tube refrigerator.

The load bearing means may be a combination of single and multi-stage pulse tube refrigerators.

The pulse tube refrigerator may have different geometric structures.

The regenerator tube of the pulse tube refrigerator is interconnected with the pulse tube may have different geometric structures.

A preferred embodiment of the invention will now be described with reference to the accompanying drawings, wherein.

Figure 5:
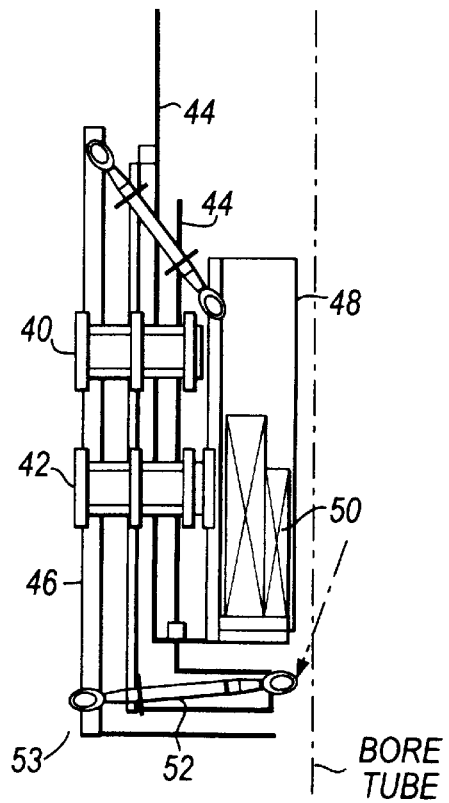
Figure 6:
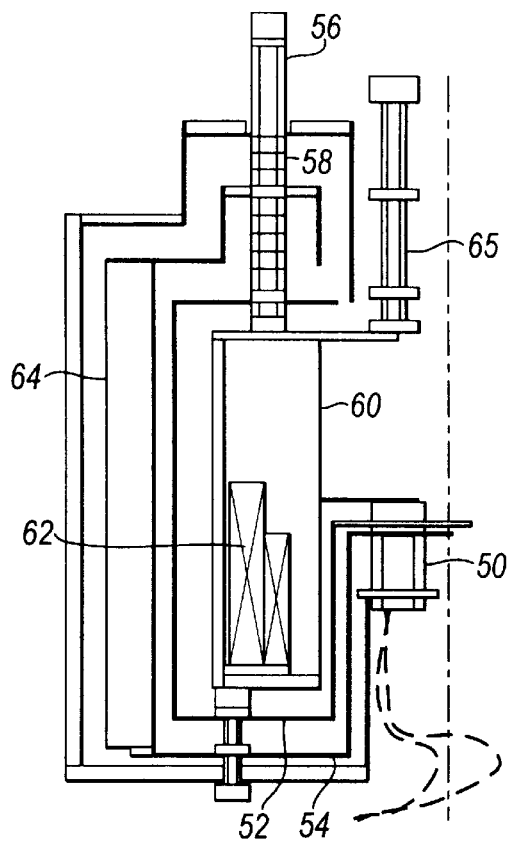
Figure 7:
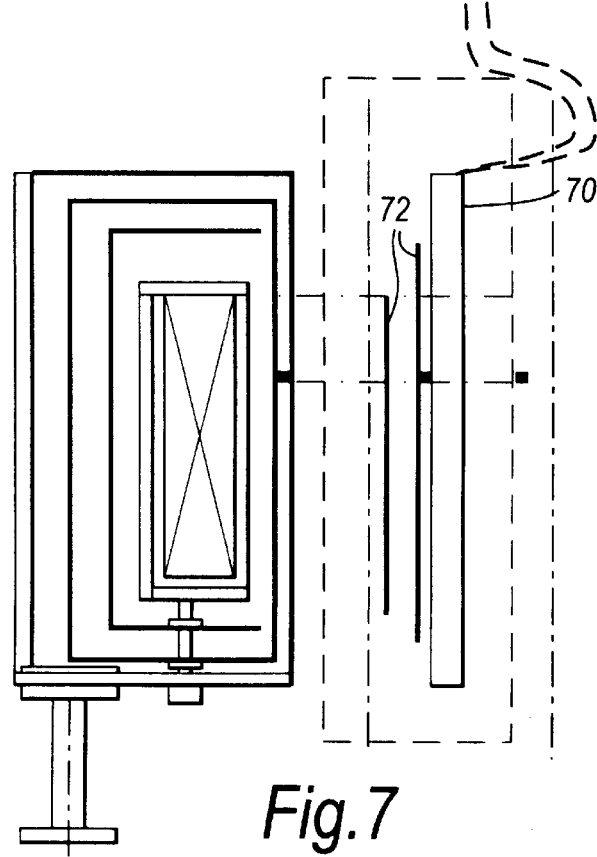
Figure 8A:
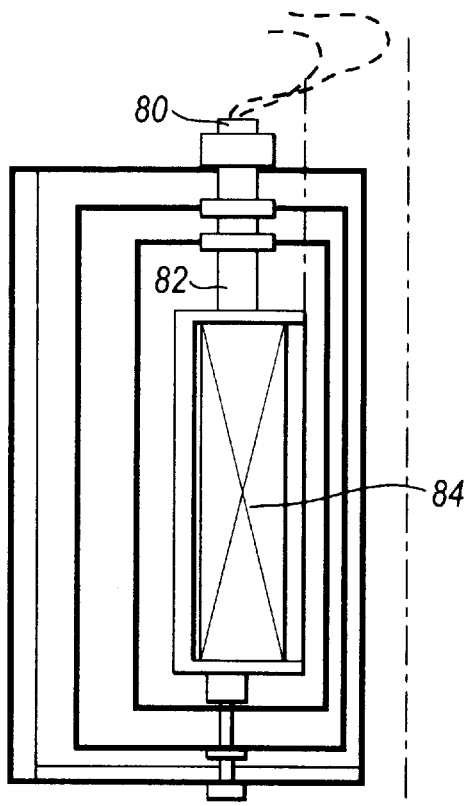
Figure 8B:
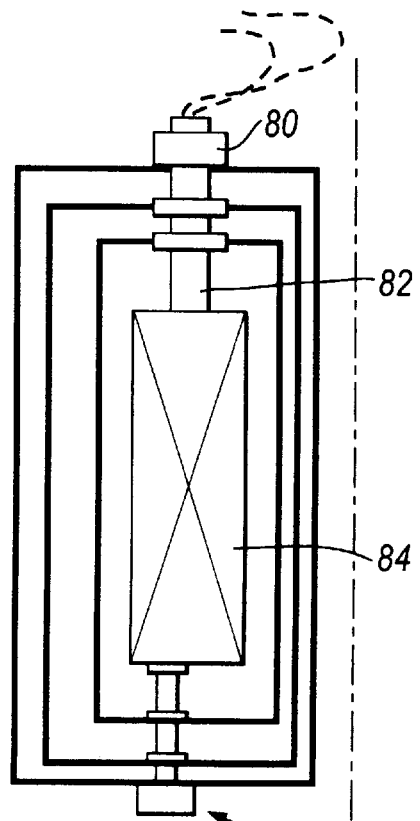

FIG. 5 shows an arrangement for horizontal mounting of the pulse tube refrigerators in an NMR cryostat, FIG. 6 shows an insertion of a pulse tube refrigerator in a centre bore of an NMR cryostat, FIG. 7 shows an annular-type pulse tube refrigerator integrated into the room temperature bore tube of an NMR cryostat, and, FIGS. 8a and 8b show a pulse tube refrigerator attached to a wet and dry open/closed NMR magnet system respectively.

Figure 1:
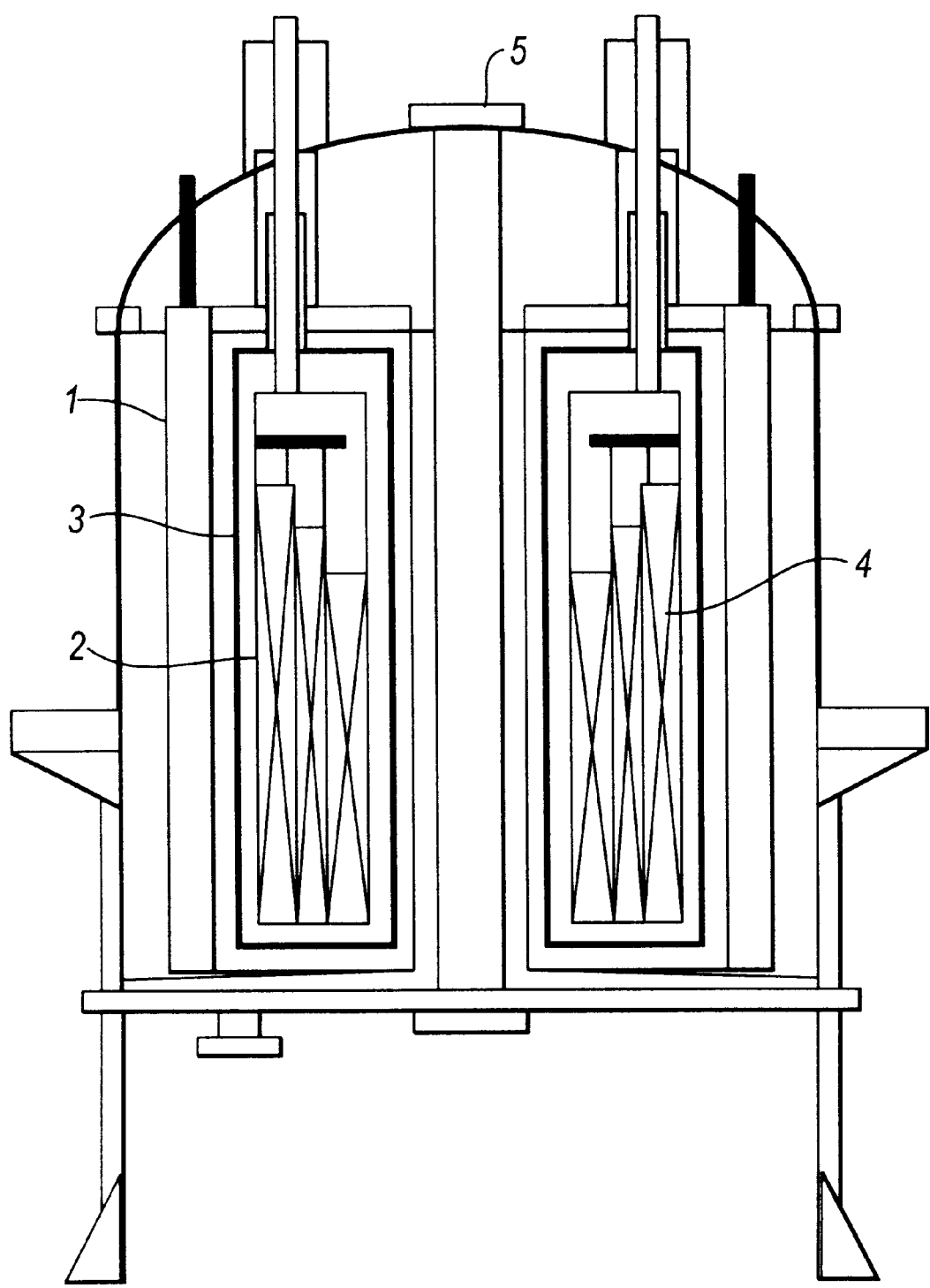
Figure 2:
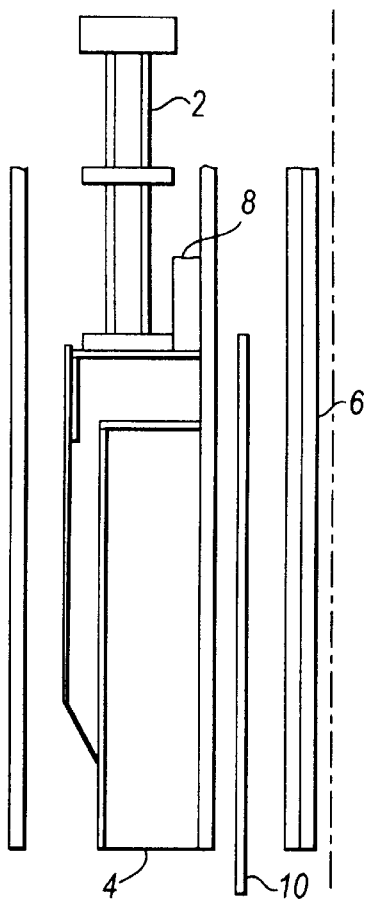
FIG. 2 shows a single stage pulse tube inserted into a typical NMR cryostat.

FIG. 2 shows a single-stage pulse tube refrigerator 2 inserted into a typical NMR cryostat and used as an indirect cooling arrangement for the nitrogen can. The pulse tube refrigerator is conveniently thermally linked to a copper ring 8 around the neck of a bucket and pot-type NMR, ESR or ICR dewar. It is a common practice to suspend superconducting magnets and radiation shields directly from the neck tubes where the number of neck tubes and their wall thickness provide sufficient strength to carry the total load. It is further very common to insert a floating shield 10 in between the nitrogen can 4 and the helium vessel 6 to further minimise boil-off of liquids. The term "floating" means mechanically fixing the shield only on the neck tube of the cryostat. With cryostats housing high-field strength magnets e.g., the whole range of 300 to 1000 MHz, this type of suspension system needs to be designed to be fairly rigid to suspend magnet loads of up to e.g. 2000 kg for a super high-field NMR system. The total weight also depends on whether the magnet system is of actively-shielded design or not.

In accordance with the present invention it is possible to suspend these typical weights on the pulse tube refrigerator or an arrangement of pulse tube refrigerators. For example, if the pulse tube refrigerator is capable of carrying the main load, the size and number of turrets required could then be reduced to a minimum. In turn, this reduction yields a lower heat input into the system by keeping the radiation shield at lower temperatures and thus further minimises boil-off of liquids. The term "liquid" applies to the total range of liquids used in cryogenics, e.g. helium, nitrogen or neon and other liquids which could be used for high-temperature superconducting magnets.

Furthermore, in order to increase the mechanical load capacity of the otherwise thin-walled pulse tube refrigerator, a reinforcement of the tube or an increase in the wall thickness, or a change in material is envisaged. The wall thickness e.g. could be increased by wrapping several layers of glass fibre reinforced epoxy resin mats around the tube. or by reinforcing the tube by fixing longitudinal fins, or simply by changing the material e.g. high-strength materials. Such typical non-magnetic high-strength materials are the commonly used aramide or carbon fibre composites, glass-fibre epoxy resins or titanium alloys, or other high-strength stainless steels for use in the cryogenic temperature range.

Figure 3:
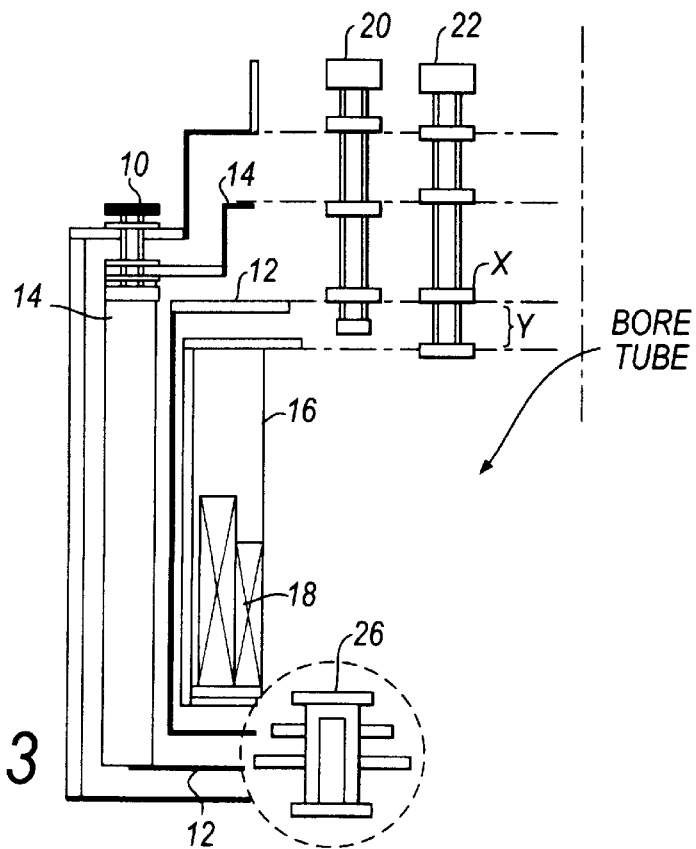
FIG. 3 shows a direct cooling arrangement for a pot-type system.

FIG. 3 shows a direct cooling arrangement wherein direct contact of the pulse tube refrigerator 10 is made with a radiation shield 14 and kept at temperatures in the cryogenic range, e.g. the liquid nitrogen temperature. The pulse tube refrigerator 10 could either be directly connected to the nitrogen can 14 or to the top plate. As this plate is usually thin-walled and flexible, the pulse tube can freely contract or expand, with a small deflection of the plate taking place. In case a dual-stage pulse tube is inserted the shield loads could be carried as well.

FIG. 3 also shows a helium vessel 16 enclosing an NMR magnet 18. Two further pulse tube refrigerators 20, 22 are shown, one of which would be inserted into the neck of the NMR cryostat in accordance with the required purpose. The pulse tube refrigerator 20 would support the radiation shields 12, 14, whereas the pulse tube refrigerator 22 would also suspend the load of the helium vessel 16 at point Y. The end section Y could be made of carbon fibre composite.

FIG. 3 further shows a pulse tube refrigerator 26 which may be used as a support for the helium vessel 16, and radiation shields 12 and 14. The outer wall of the pulse tube refrigerator 26 may be reinforced with epoxy resin composite. In so doing, the loads exerted by the overall cryostat structure can be supported very efficiently by one pulse tube only. The pulse tube refrigerator 26 may be included in a column of the Heim/Hartwig/SSC type.

Furthermore, the cold end fixture could be designed of a material with a negative thermal expansion coefficient, as described by Hartwig, (Thermal expansion of polymers and fibre composites at low temperatures,) in Advances in Cryogenic Engineering 1990, Vol 26, page 1007.

Also the pulse tube refrigerator 20, 22 could be a dual-stage refrigerator which would obviate the need for the nitrogen can pulse tube refrigerator 10.

Figure 4:
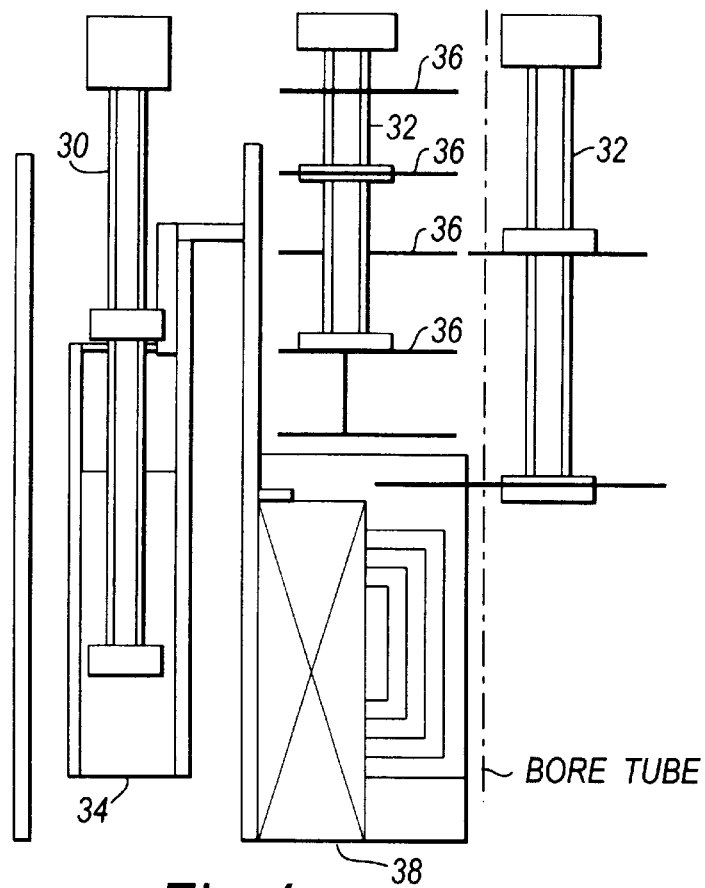
FIG. 4 shows a direct cooling arrangement for an NMR bucket-type cryostat.

FIG. 4 shows another direct cooling application of the pulse tube refrigerators 30, 32 in a bucket-type NMR-system. The pulse tube refrigerator 30 cools and supports the nitrogen can 34. The pulse tube refrigerator 32 is used to support the radiation shields 36, at the first or second stages. A further application provides additional support of the NMR magnet 38 by directly connecting the pulse tube refrigerator 32 to the magnet 38. The magnet is therefore suspended or fixed either directly, or indirectly by using an intermediate tube consisting of epoxy or any other material with low-heat conduction properties in between the pulse tube and the magnet and thus providing a means for interfacing the magnet and the pulse tube refrigerator.

This support would also simultaneously cool itself and thus does not add heat to the total heat balance of the system. Thus, again boil-off is further minimised.

FIG. 5 shows an arrangement for mounting the pulse tube refrigerator perpendicular to the magnet axis.

Two horizontally mounted pulse tube refrigerators 40, 42 are provided for supporting and cooling the radiation shields 44. The pulse tube refrigerator 42 also supports the helium vessel 48, housing the magnet 50. Several pulse tube refrigerators of the same kind could be arranged in parallel along the circumference of the vessel to cool and support the shield structure.

In order to avoid contact or movement of the inner radiation shields towards each other, which would cause thermal short-circuiting, and to maintain the extremely small, usually only about 2 or 3 mm, clearance between the inner shields located in the vertical bore, provision has to be made for rigid fixing of these shields by using struts 52. The struts therefore maintain shield separation during all modes of operation, including transport, cooldown and warm up.

Furthermore, the struts may include a pulse tube refrigerator, or could be a pulse tube refrigerator per se, with suitable reinforcement, so that the pulse tube refrigerator supports the shields 44 and keeps the clearance between them and also avoids any introduction of vibration into the system due to the rigid spring-loaded fixture and the tube ends 53. The arrangement would cool the radiation shields affixed to it, in particular the bottom plate assembly of the cryostat which is most susceptible to heat leaks, as this is the location where superinsulation cannot effectively be installed, and thus boil-off is further reduced.

FIG. 6 shows the insertion of a pulse tube refrigerator 50 into the centre bore of an NMR system from below, securing the shields and safeguarding against shield contacts, at the same time cooling the shields 52, 54 and still leaving access for the probe to the warm bore. It also has good thermal contact conductivity at the contact surfaces. FIG. 6 shows the fixed/removable pulse tube refrigerator 56 in the neck tube with baffles 58 attached and shields thermally linked at the radiation contact stages. Thus retrofitting a pulse tube into existing NMR systems can be facilitated. It will be appreciated that the use of pulse tube refrigerator 56 is an alternative to the pulse tube refrigerator 50.

The present invention is extended to any NMR system which does not need any nitrogen or liquid inventory.

A further advantage of the present invention is that liquid nitrogen is not needed any longer if the pulse tube is used for suspending a radiation shield and maintaining the temperature of liquid nitrogen or below. Clearly the benefits are reduced cryostat costs, a safe nitrogen-free cryo-environment for the user and no need for refilling, which most probably has to be effected otherwise fortnightly or monthly.

Furthermore the cryostat size can be reduced and the boil-off nearly eliminated as the cooler may cool the radiation shields down to 10K. Because one portion of the heat load onto the system derives from the central bore part, where one radiation shield is usually omitted, the boil-off of a typical system is in the range 5 to 80 ml/h, and is mainly caused by radiation. If the shields can be cooled to 10K, the boil-off could be, to give a rough estimate, reduced more than 200 times lower than before. For some systems this would mean a near zero-loss system which also provides for an inherent back-up of liquids.

The present invention extends to a system where a neck-pulse tube refrigerator is introduced to the system in order to limit the required number of neck tubes for suspending a magnet, comprising a self-cooled suspension system, and reducing the number of open window areas which would otherwise transmit radiation between the higher and lower temperature levels.

In FIG. 6, reference 65 shows that this type of pulse tube is of the annular type, and may be used as a neck tube for suspending the magnet.

The system as described enables free access which is vital for various purposes, e.g. when quench gas has to be released to the atmosphere or by simply providing a means for access to cryostat and magnet for filling liquids and energising the magnet, or for diagnostics purposes.

FIG. 7 shows an annular-type pulse tube refrigerator 70, which is integrated in the room temperature bore tube of the NMR system.

This design configuration has an additional advantage of completely integrating the cooling system at a conveniently accessible location.

The pulse tube refrigerator is used to support and cool the shields 72 which surround the magnet assembly 74. Thus only one neck-tube is required having enough cross-sectional area for gas flow in case of a quench or in case of vacuum collapse of the system, or e.g. for being able to directly access the magnet for diagnostics purposes, loading the magnet and other tasks. The pulse tube refrigerator essentially comprises only a small vertical section of the annular wide-bore tube depending on the desired volume of the pulse tube refrigerator to achieve the cooling power, thus being an "invisible" part of the cryostat. This is of particular importance as the design of the room temperature bore tube spans a diameter range of 50 to 80 mm and thus coincides with most present-day pulse tube and regenerator tube volumes.

Due to the small overall size of the NMR system, a single-stage pulse tube could be conveniently used to cool one shield only, instead of having to use two, down to temperatures below, e.g. 40K, which means that the overall system size can again be reduced drastically as e.g. the nitrogen can and the intermediate shield are replaced by one shield only.

The general reduction in diameter is of particular interest when designing actively-shielded NMR-magnet systems because this would otherwise substantially increase the diameter of the cryostat.

FIG. 8a shows a pulse tube refrigerator 80 attached to a wet open/closed NMR magnet system having a heat pipe 82 connected between the refrigerator and the helium vessel 84 containing the magnet. The heat pipe provides rapid cooldown of the magnet.

FIG. 8b shows a pulse tube refrigerator 80 attached to a dry open/closed NMR magnet system having a heat pipe 82 connected between the refrigerator and the magnet 85 for rapid cooldown of the magnet.

The heat pipe fitted on the first stage facilitates cooldown of the magnet and reduces that time required to a minimum. After cooldown has been effected or the temperature of the magnet has reached its specified temperature the heat pipe takes over the function of the epoxy tube mentioned above, as only a support for the magnet.

As the heat pipe is made of epoxy or of another low-conductance material or a combination of a thin-walled tube with an epoxy or another plastics lining, the parasitic heat travelling down to the magnet is small so that consequently the cooling of the adjacent radiation shields is resumed after cooldown has been effected.

In case of the superconducting magnet going normal the cryogenic heat pipe resumes operation and cools down the magnet again within a short time.

Furthermore, the pulse tube's first stage could be attached to the heat pipe which is directly attached to the magnet. The second stage of the pulse tube is then designed in parallel to the heat pipe to directly support and cool the magnet for dry open or closed NMR designs, once cooling has been effected.

The benefits of the invention described above are not limited to the embodiments disclosed. For example, the single-stage pulse tube refrigerator NMR-system most probably would be used as a shield cooler for suspending the shields and preferably the magnet (if necessary with an attached epoxy tube) if feasible, and such a cooler would then be used for a temperature range of 20 to 40 K.

Also, the pulse tube refrigerator could be inserted into any other opening, for example, into any other convenient dewar exit.

The present invention may also be used in the field of application for electron-spin resonance (ESR) and/or ion cyclotron resonance (ICR).

The pulse tube or regenerator tube may take the form of different geometrical shapes, e.g. conical, round or square-shaped tubes, annular, coil shaped, bent or angled.

What is claimed is:

1. Load bearing apparatus for an NMR system, comprising:
    at least one pulse tube refrigerator arranged to suspend members in the NMR system, whilst simultaneously cooling the members.

2. Load bearing apparatus as claimed in claim 1, wherein the pulse tube refrigerator is a multi-stage pulse tube refrigerator.

3. Load bearing apparatus as claimed in claims 1, wherein a combination of single and multi-stage pulse tube refrigerators are provided.

4. Load bearing apparatus as claimed in claim 1, wherein the pulse tube of the pulse tube refrigerator can take the form of different geometric structures.

5. Load bearing apparatus as claimed in claim 4, further comprising:
    a plurality of contacting means which connect a pulse tube of the pulse tube refrigerator to at least one member selected from the group consisting of radiation shields and a superconducting magnet.

6. Load bearing apparatus as claimed in claim 5, wherein:
    the pulse tube is a two-stage pulse tube;
    a first stage of the two-stage pulse tube is arranged to cool a first radiation shield; and
    a second stage of the two-stage pulse tube is arranged to cool a second radiation shield.

7. Load bearing apparatus as claimed in claim 1, further comprising:
    a regenerator tube of the pulse tube refrigerator, which is interconnected with a pulse tube and can take the form of different geometric structures.

8. Load bearing apparatus as claimed in claim 7, wherein the regenerator tube acts as a room temperature bore tube carrying shield loads.

9. Load bearing apparatus as claimed in claim 7, further comprising:
    a plurality of contacting means which connect a pulse tube of the pulse tube refrigerator to at least one member selected from the group consisting of radiation shields and a superconducting magnet.

10. Load bearing apparatus as claimed in claims 1, wherein the pulse tube is a direct cooler to cool a magnet interface and provide suspension for the magnet.

11. Load bearing apparatus as claimed in any preceding claim 1, wherein the pulse tube is reinforced.

12. Load bearing apparatus as claimed in claim 1 wherein the pulse tube is annulus-shaped, for use as a neck tube in an NMR system.

13. Load bearing apparatus as claimed in a any preceding claim 1 for open wet and dry magnet NMR systems with access to a vertical or horizontal bore tube axis.

14. Load bearing apparatus for an NMR system, comprising:
    at least one pulse tube refrigerator arranged to support members in the NMR system, whilst simultaneously cooling the members.

15. Load bearing apparatus as claimed in claim 14, wherein the pulse tube refrigerator is a multi-stage tube refrigerator.

16. Load bearing apparatus as claimed in claim 14, wherein a combination of single and multi-stage pulse tube refrigerators are provided.

17. Load bearing apparatus as claimed in claim 14, wherein the pulse tube of the pulse tube refrigerator can take the form of different geometric structures.

18. Load bearing apparatus as claimed in claim 14, further comprising:
    a refrigerator tube of the pulse tube refrigerator, which is interconnected with a pulse tube and can take the form of different geometric structures.

19. Load bearing apparatus as claimed in claim 18, wherein the regenerator tube acts as a room temperature bore tube carrying shield loads.

20. Load bearing apparatus as claimed in claim 14, wherein the pulse tube is a direct cooler to cool a magnet interface and provide suspension for the magnet.

21. Load bearing apparatus as claimed in claim 14, wherein a pulse tube of the pulse tube refrigerator is arranged to support and cool the radiation shield and a superconducting magnet.

22. Load bearing apparatus as claimed in claim 14, wherein the pulse tube is reinforced.

23. Load bearing apparatus as claimed in claim 14, wherein the pulse tube is annulus-shaped, for use as a neck tube in an NMR system.

24. Load bearing apparatus as claimed in claim 14 for open wet and dry magnet NMR systems with access to a vertical or horizontal bore tube axis.

* * * * *